United States Patent
Hammerschmied et al.

(10) Patent No.: US 11,127,990 B2
(45) Date of Patent: Sep. 21, 2021

(54) BATTERY MODULE HAVING FIXING STRUCTURE FOR TEMPERATURE SENSING ELEMENT

(71) Applicant: Samsung SDI Co., Ltd., Yongin-si (KR)

(72) Inventors: Helmut Hammerschmied, Graz (AT); Maximilian Hofer, Hartberg (AT); Urban Cotic, Lovrenc na Pohorju (SI)

(73) Assignee: Samsung SDI Co., LTD., Yongin-si (KR)

( * ) Notice: Subject to any disclaimer, the term of this patent is extended or adjusted under 35 U.S.C. 154(b) by 303 days.

(21) Appl. No.: 16/342,147

(22) PCT Filed: Sep. 25, 2017

(86) PCT No.: PCT/KR2017/010554
§ 371 (c)(1),
(2) Date: Apr. 15, 2019

(87) PCT Pub. No.: WO2018/080033
PCT Pub. Date: May 3, 2018

(65) Prior Publication Data
US 2019/0237817 A1    Aug. 1, 2019

(30) Foreign Application Priority Data

Oct. 25, 2016   (EP) .................................... 16195595
Sep. 22, 2017   (KR) ........................ 10-2017-0122623

(51) Int. Cl.
*H01M 10/42*     (2006.01)
*H01M 10/48*     (2006.01)
(Continued)

(52) U.S. Cl.
CPC ....... *H01M 10/425* (2013.01); *H01M 10/486* (2013.01); *H01M 10/625* (2015.04);
(Continued)

(58) Field of Classification Search
CPC ............. H01M 10/425; H01M 10/486; H01M 10/637; H01M 2010/4271;
(Continued)

(56) References Cited

U.S. PATENT DOCUMENTS

2011/0039134 A1   2/2011   Kim et al.
2012/0015215 A1   1/2012   Kim
(Continued)

FOREIGN PATENT DOCUMENTS

CN    101997093 A    3/2011
CN    102468023 A    5/2012
(Continued)

OTHER PUBLICATIONS

Extended European Search Report for corresponding European Patent Application No. 16195595.0, dated Dec. 12, 2016, 9pp.
(Continued)

*Primary Examiner* — Christopher P Domone
(74) *Attorney, Agent, or Firm* — Lewis Roca Rothgerber Christie LLP (57) ABSTRACT

The present invention relates to a battery module, and the battery module includes at least one battery cell, a protection circuit module that includes a rigid printed circuit board, and is electrically connected with the battery cell, at least one temperature sensing element provided at a surface of the battery cell, and a flexible printed circuit board that electrically connects the protection circuit module and the temperature sensing element.

6 Claims, 5 Drawing Sheets

(51) Int. Cl.
  *H01M 2/10* (2006.01)
  *H05K 1/00* (2006.01)
  *H01M 10/637* (2014.01)
  *H01M 10/625* (2014.01)
  *H01M 50/20* (2021.01)
(52) U.S. Cl.
  CPC ......... *H01M 10/637* (2015.04); *H01M 50/20* (2021.01); *H05K 1/00* (2013.01); *H01M 2010/4271* (2013.01); *H01M 2200/10* (2013.01); *H01M 2200/105* (2013.01); *H01M 2200/106* (2013.01); *H01M 2220/20* (2013.01)
(58) Field of Classification Search
  CPC ....... H01M 2200/10; H01M 2200/105; H01M 2200/106; H05K 3/36; H05K 3/361; H05K 3/4691
  See application file for complete search history.

(56) References Cited

U.S. PATENT DOCUMENTS

| | | | |
|---|---|---|---|
| 2012/0019061 A1* | 1/2012 | Nishihara | H01M 50/502 |
| | | | 307/10.1 |
| 2012/0121939 A1 | 5/2012 | Yoo | |
| 2012/0121940 A1 | 5/2012 | Park | |
| 2012/0129013 A1 | 5/2012 | Lee | |
| 2012/0251849 A1 | 10/2012 | Park et al. | |
| 2012/0298433 A1 | 11/2012 | Ohkura | |
| 2013/0164569 A1 | 6/2013 | Srinivasan et al. | |
| 2013/0252074 A1 | 9/2013 | Hsiao et al. | |
| 2014/0017533 A1* | 1/2014 | Nishihara | H01M 50/172 |
| | | | 429/93 |
| 2014/0120401 A1* | 5/2014 | Shin | H05K 3/363 |
| | | | 429/123 |
| 2014/0147705 A1 | 5/2014 | Wang et al. | |
| 2014/0212695 A1 | 7/2014 | Lane et al. | |
| 2016/0141585 A1 | 5/2016 | Berg et al. | |
| 2016/0204481 A1 | 7/2016 | Ryu | |
| 2016/0233561 A1 | 8/2016 | Lee | |
| 2016/0372796 A1* | 12/2016 | Nishihara | H01M 50/20 |

FOREIGN PATENT DOCUMENTS

| | | |
|---|---|---|
| CN | 102800904 | 11/2012 |
| CN | 103325979 A | 9/2013 |
| CN | 104854729 A | 8/2015 |
| CN | 104870240 A | 8/2015 |
| CN | 105378975 A | 3/2016 |
| EP | 2 453 513 B1 | 5/2014 |
| KR | 10-2012-0053458 A | 5/2012 |
| KR | 10-2012-0055238 A | 5/2012 |
| KR | 10-1147203 B1 | 5/2012 |
| KR | 10-2015-0033856 A | 4/2015 |
| KR | 10-2015-0103415 A | 9/2015 |
| KR | 10-2016-0061638 A | 6/2016 |
| KR | 10-2016-0085621 A | 7/2016 |
| KR | 10-1642341 B1 | 7/2016 |

OTHER PUBLICATIONS

Chinese Office action issued in corresponding application No. CN 201780066245.6, dated Jul. 27, 2021 9 pages.

* cited by examiner

BATTERY MODULE HAVING FIXING STRUCTURE FOR TEMPERATURE SENSING ELEMENT

CROSS-REFERENCE TO RELATED APPLICATION(S)

This application is a National Phase Patent Application of International Patent Application Number PCT/KR2017/010554, filed on Sep. 25, 2017, which claims priority to European Patent Application No. 16195595.0, filed Oct. 25, 2016, and Korean Patent Application No. 10-2017-0122623, filed Sep. 22, 2017. The entire contents of all of which are incorporated herein by reference.

TECHNICAL FIELD

The present invention relates to a battery module including a specific alignment for fixing between a temperature sensing element that is appropriate for temperature measurement of a battery cell, and a protection circuit module.

BACKGROUND ART

Unlike a primary battery, a rechargeable battery can iteratively perform charging and discharging, while the primary battery provides only non-reversible conversion of chemical energy to electrical energy. A rechargeable battery with low capacity is used in a small portable electronic device such as a mobile phone, a notebook computer, and a camcorder, and a rechargeable battery with high capacity may be used as a motor driving power source for a hybrid vehicle and an electric vehicle.

In general, the rechargeable battery includes an electrode assembly that includes a positive electrode, a negative electrode, and a separator disposed between the positive electrode and the negative electrode, a case that receives the electrode assembly, and an electrode terminal that is electrically connected to the electrode assembly. An electrolyte solution is injected into the case so that the battery can be charged and discharged through the electrochemical reaction of the positive electrode, the negative electrode, and the electrolyte solution. The shape of the case, such as cylindrical, rectangular, and the like, is changed depending on the purpose of the battery.

The rechargeable battery can be used as a battery module having a plurality of unit battery cells connected in series and/or in parallel so as to provide high energy density required for driving a motor of a hybrid vehicle and the like. That is, the battery module is formed by connecting electrode terminals of the plurality of battery cells to implement high-output power required by an electric vehicle and the like.

The battery modules may be formed in a design of a block or a module. In a block-type design, each battery is connected with one common current control structure and battery management system, and is disposed in a housing as a unit. In the module-type design, a plurality of battery cells are connected to sub-modules, and a plurality of sub-modules are connected such that a module is formed. The battery management function can be at least partially implemented in a module level or a sub-module level, and accordingly, compatibility can be improved. In order to form an electrical system, one or more battery modules are mechanically and electrically integrated, a thermal management system needs to be provided, and communication with one or more electric consumers is required. The thermal management system generally includes a protection circuit module that is disposed adjacent to the battery cells.

Static control of battery power output and charging is not sufficient to satisfy a dynamic power demand of various electrical consumers connected to the battery system. Therefore, it is necessary to continuously exchange information between the battery system and a control unit of the electric consumer. The information includes important information such as an actual charge state (SoC) of the battery system, potential electrical performance, charge capability, and internal resistance, as well as actual or predicted power demand and surplus of the consumer. A temperature of the battery cell is defined as one parameter for controlling a state of each battery cell. Thus, a temperature sensing element is provided in the battery module. Meanwhile, in vehicles, there may be a strong external impact, and thus some solutions have been suggested for maintaining the temperature sensing element at a surface of the battery cell. Such attempts have resulted in a mechanically complicated fixing structure by using multiple parts, which increases manufacturing and material costs, thereby increasing a manufacturing cost of the battery module.

DISCLOSURE

Technical Problem

The present invention has been made in an effort to provide a battery module that can partially solve or remove the above-state drawbacks, and can be formed by a simple manufacturing process with inexpensive members.

Technical Solution

According to the present invention, one or more drawbacks according to a conventional art can be overcome or reduced. In particular, a battery module that includes at least one battery cell, a protection circuit module that includes a rigid printed circuit board, and is electrically connected with the battery cell, at least one temperature sensing element provided at a surface of the battery cell, and a flexible printed circuit board that electrically connects the protection circuit module and the temperature sensing element, is provided.

That is, according to one aspect of the present invention, the battery module in which a function and a location of the temperature sensing element provided at the surface of the battery cell can be assured even when relative movement between the battery cell and the protection circuit module occurs by external impact. Accordingly, a manufacturing process should be simple to prevent an increase of manufacturing cost. In order to achieve this, the temperature sensing element is directly disposed on the surface of the battery cell and then connected to the protection circuit module by using the flexible printed circuit board.

The flexible printed circuit is formed of a plurality of aligned conductors combined to a thin insulation film. The flexible circuit requires less manual work during an assembly process, and reduces occurrence of errors in the manufacturing process. The flexible circuit has unique features that are a combination of form, fit, and function. The flexible circuit eliminates the necessity of routing, covering, and soldering, which require a high cost. An error due to wiring can be eliminated, and a process cost can be reduced. However, the protection circuit module is not appropriate in implementation of the flexible printed circuit board compared to a rigid circuit substrate that provides high component density. Accordingly, the battery module according to the present invention combines merits of rigid and flexible circuits.

According to an exemplary embodiment of the present invention, the rigid printed circuit board includes a slit, and the flexible printed circuit board extends to a top surface of the rigid printed circuit board from the temperature sensing element through the slit and is combined with the protection circuit module at the top surface of the rigid printed circuit board. That is, connection between a temperature sensor and the protection circuit module is carried out at an upper surface of the rigid printed circuit board. The flexible printed circuit board passes through a dedicated slit in the rigid printed circuit board rather than reaching the top surface through an outer edge of the rigid printed circuit board. Thus, the flexible printed circuit board and the wiring pattern on the rigid printed circuit board can easily contact each other at the upper side of the battery module through a typical bonding process such as soldering and the like.

According to another exemplary embodiment of the present invention, the battery module includes a foam member disposed between a bottom surface of the rigid printed circuit board and the temperature sensing element. The foam member may be formed of an electrically insulating material. Such a foam member can be easily disposed at a predetermined location. For example, a flexible printed circuit board in which the temperature sensing element is provided at one of ends thereof can be fixed to a surface of the battery cell by an adhesive. Next, the foam member is disposed in the temperature sensing element, and thus, when the protection circuit module is mounted, the other end of the flexible printed circuit board passes through the slit. According to another manufacturing method of the present invention, the foam member may be formed after mounting the protection circuit module by extruding a foam compound into a gap between the temperature sensing element and the rigid printed circuit board.

According to another exemplary embodiment of the present invention, a conductive adhesive layer is provided between the temperature sensing element and a surface of the battery cell. Thus, a location of the temperature sensing element can be fixed at the surface of the battery cell. Alternatively, the flexible printed circuit board may be soldered to the rigid printed circuit board. One end of the flexible printed circuit board where a temperature sensing member is disposed passes through the slit, and is then fixed to the rigid printed circuit board by the foam member. Next, a temperature element is fixed to the foam member. While the rigid printed circuit board is assembled to the top surface of the battery cell, the temperature sensing member is pressed to the cell surface. An adhesive disposed between the temperature sensing member and the cell surface can assure thermal contact. While the adhesive is cured, the foam member assures a pressure required for the contact.

Another aspect of the present invention provides a vehicle including the battery module.

An additional aspect of the present invention can be derived from the dependent claims or the description to be described later.

Advantageous Effects

According to the exemplary embodiment of the present invention, the temperature sensing element can be fixed to a surface of the battery cell through a simple structure and method. Accordingly, the manufacturing cost of the battery module can be prevented from increasing.

DESCRIPTION OF THE DRAWINGS

In the following detailed description, only certain exemplary embodiments of the present invention have been shown and described, simply by way of illustration.

MODE FOR INVENTION

Hereinafter, basic features of the present invention and a method for achieving the present invention can be more easily understood by referring to the detailed description of exemplary embodiments and accompanying drawings. Parts duplicated with descriptions are omitted for clear description of the present invention, and like reference numerals designate like elements throughout the specification. The present invention can be implemented in various other forms, and thus the present invention is not necessarily limited to the embodiments shown in the drawings. These embodiments are means for thoroughly and completely describing the features and various aspects of the present invention, and are provided as examples for helping full understanding by those skilled in the art. Thus, for a thorough understanding of the features of the present invention, unnecessary explanations, that is, of processes, components, and techniques, will be omitted to those skilled in the art. Throughout the specification, like reference numerals designate like elements, and duplicated description with the same constituent elements will be omitted. In the drawings, several constituent elements, layers, and regions are exaggerated for clarity.

A spatial representation, such as below, under, at a lower portion, on, above, or at an upper portion, is intended to compare features of one component relative to other components as shown in the figures. On the other hand, since the components may have different directions or may be arranged in various spaces depending on the use or operation of the device, the spatial representation is not necessarily limited by the illustrated aspects of the present invention. For example, if the direction of the device shown in the drawing is inverted, one component described below, under, or at a lower portion will be oriented on, above, or an upper portion relative to the other component. Thus, the expressions below and above may include both upward and downward directions. Also, the device may be interpreted as being disposed in various directions, such as being able to rotate by 90 degrees or another direction.

When a component or layer is referred to as being connected or coupled on another component or layer, it may be directly connected to another component or layer, or at least one another component or layer may exist between the components. In addition, a component or layer may solely exist between two different components or layers, and at least one intermediate component or layer may be disposed between the components.

Although not specifically defined, all of the terms including technical and scientific terms used herein have meanings understood by persons ordinarily skilled in the art. The terms have specific meanings coinciding with related technical references and the present specification, as well as lexical meanings. That is, the terms are not to be construed as having idealized or formal meanings.

Figure 1:
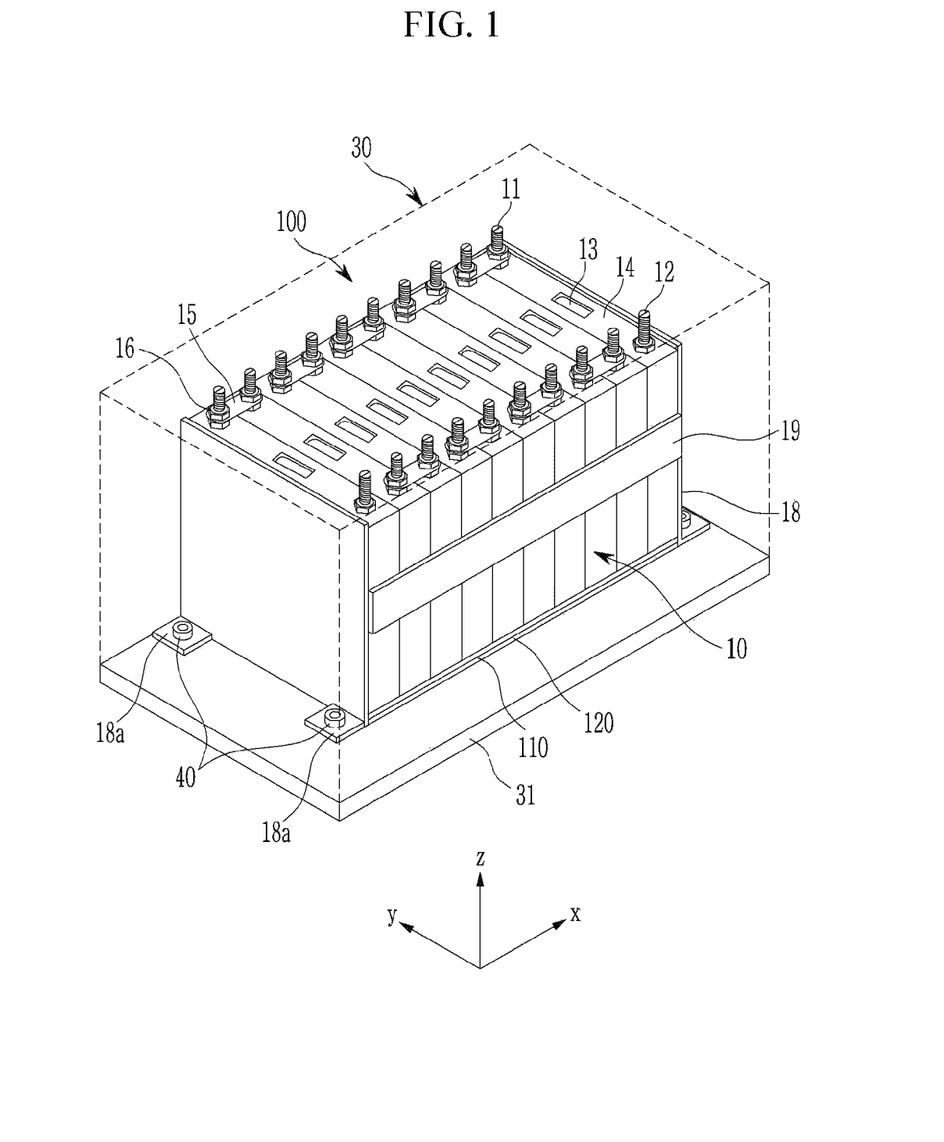
FIG. 1 is a perspective view of a battery module.

Referring to FIG. 1, a battery module 100 according to an exemplary embodiment includes a plurality of battery cells 10 arranged in one direction, and a heat exchange member 110 that is disposed to be adjacent to bottom sides of the plurality of battery cells 10. A pair of end plates 18 are provided to face a side surface of the battery cell 10 at the outside of the battery cell 10, and a connection plate 19 connects the pair of end plates 18 to fix the plurality of battery cells 10 together. Fastening portions 18a formed at opposite sides of the battery module 100 are fixed to a support plate 31 through bolts 40. The support plate 31 is a part of a housing 30. In addition, an elastic member 120 formed of rubber or another elastic material may be disposed between the support plate 31 and the heat exchange member 110.

Here, each battery cell 10 is a prism-shaped (or quadrangular-shaped) cell, and a wide plane of each cell is layered such that a battery module is formed. In addition, each battery cell 10 includes an electrode assembly and a battery case receiving an electrolyte solution. The battery case is sealed by a cap assembly 14. The cap assembly 14 is provided with a positive terminal 11, a negative terminal 12, and a vent 13. The positive terminal 11 and the negative terminal 12 have different polarities. The vent 13, which is a safety means of the battery cell 10, functions as a path through which a gas generated by the battery cells 10 is discharged to the outside. Positive terminals 11 and negative terminals 12 of neighboring battery cells 10 are electrically connected through a bus bar 15, and the bus bar 15 may be fixed by a fastening means such as a nut 16 and the like. Thus, the battery module 100 may be used as a power device by electrically connecting the plurality of battery cells 10 as a bundle. As the battery cell 10, a rechargeable battery such as a lithium secondary battery may be used. The battery module 100 may be a 48 V battery used in a vehicle-related application. In general, the battery cell 10 generates a large amount of heat while performing charging and discharging. The generated heat is accumulated in the battery cell 10, and accelerates deterioration of the battery cell 10. Thus, the battery module 100 includes the heat exchange member 110 that is provided to be adjacent to the bottom side of the battery cell 10 to cool the battery cell 10. Further, a means for detecting a temperature of the battery cell 10 is included for safe operation of the battery module 100. Such a temperature detection means includes a protection circuit module and a temperature sensor (not shown in FIG. 1).

Figure 2:
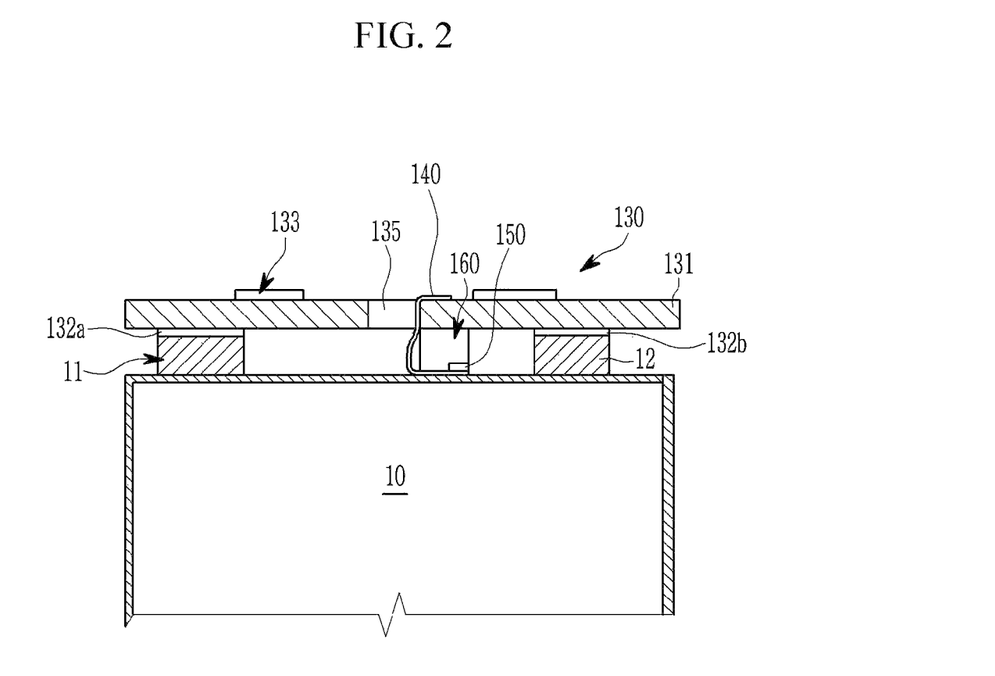
FIG. 2 is a partial cross-sectional view of a battery cell according to the present invention.
Figure 3:
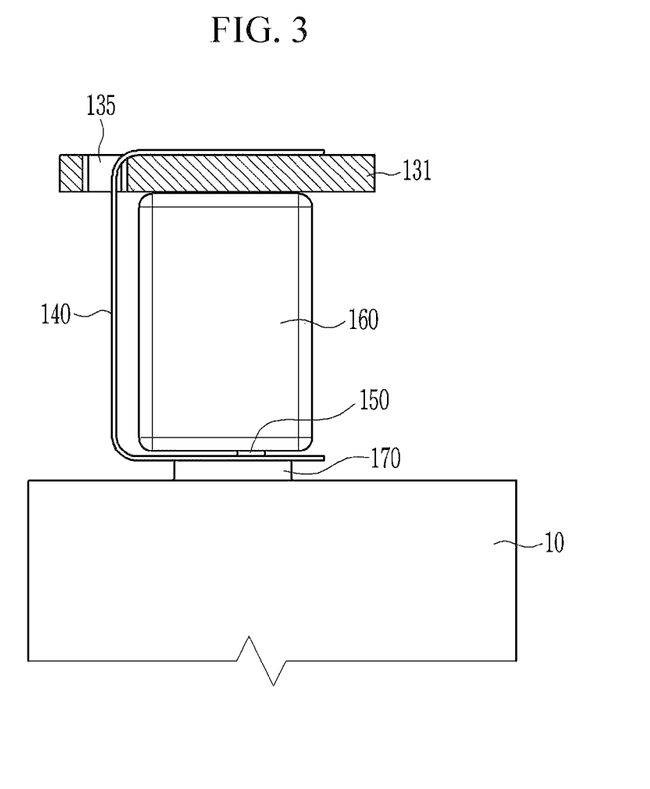
FIG. 3 is a partially enlarged cross-sectional perspective view of the battery cell of FIG. 2.

FIG. 2 is a partial cross-sectional view of a single battery call 10 of the battery module 100 in FIG. 1. FIG. 3 is a partially enlarged cross-sectional view of one area of the battery cell shown in FIG. 2, in which temperature measurement with respect to the battery cell 10 is carried out. Referring to FIG. 2 and FIG. 3, the battery module 100 includes a protection circuit module 130 electrically connected to the battery cell 10. In addition, the protection circuit module 130 is electrically connected with a temperature sensing element 150 through a flexible printed circuit board 140.

In general, each battery cell 10 of the battery module 100 is electrically connected to the protection circuit module 130. According to the present exemplary embodiment, only one protection circuit module 130 is connected to all the battery cells 10 of the battery module 100. However, two or more individual protection circuit modules may be connected to one battery cell or a set of battery cells.

The protection circuit module 130 is placed at a side surface of the battery cell 10 such that a gap is formed between a surface of the battery cell 10 and a surface of the protection circuit module 130 which faces the battery cell 10. In the present exemplary embodiment, the protection circuit module 130 is disposed on an upper surface of the battery cell 10, in which the electrode terminals 11 and 12 are disposed. In particular, the protection circuit module 130 is electrically connected with the battery cell 10 to control charging and discharging, and prevents excessive charging/discharging of the battery call 10.

The protection circuit module 130 includes a rigid printed circuit board 131 having connection terminals 132a and 132b for connection of the terminals 11 and 12 of the battery cell 10, and at least one semiconductor element 133 disposed at an upper surface of the rigid printed circuit board 131. The semiconductor element 133 may include an integrated circuit formed to compare a measurement temperature of the battery cell 10 with a threshold value for an allowable battery cell temperature. The circuit board 131 includes a wiring pattern (not shown) formed on a surface thereof. A body of the circuit board 131 may be made of a rigid electrically insulating material such as a polyimide (PI) or polyethylene (PET). The wiring pattern may be formed of an electrically conductive material such as copper (Cu), titanium (Ti), nickel (Ni), or palladium (Pd).

The connection terminals 132a and 132b may be formed by partially exposing the wiring pattern, or as implemented in the present exemplary embodiment, may be formed by further providing a conductive material such as gold (Au) and the like to the exposed portion of the wiring pattern.

The semiconductor element 133 applies a signal for controlling operation of the battery cell 10. In particular, the semiconductor element 133 controls charging and discharging through a high-current line of the battery cell 10. Further, the semiconductor element 133 applies a signal that indicates a voltage, a current, and a temperature of the battery cell 10 to prevent, for example, over-charging or over-discharging.

For this, the semiconductor element 133 applies temperature information of the battery cell 20 from the temperature sensing element 150 through the flexible printed circuit board 140, and controls operation of the battery cell 10. Here, information on the voltage, the current, and the temperature may be transmitted to the semiconductor element 133 through the wiring pattern of the circuit board 131.

The flexible printed circuit board 140 connects the temperature sensing element 150 and the protection circuit module 130 that are provided on the surface of the battery cell 10. According to an exemplary embodiment of the present invention, each of the battery cells 10 of the battery module 100 includes at least one temperature sensing element 150 to individually measure a temperature of each battery cell 10. However, in some applications, a minimum of two temperature sensing elements 150 is sufficient in the battery module 100.

The flexible printed circuit board 140 includes a sense line (not shown) for transmitting a signal from the temperature sensing element 150 connected thereto to the protection circuit module 130. Accordingly, the protection circuit module 130 can check a temperature value of the corresponding battery cell 10.

In addition, the flexible printed circuit board 140 extends between the protection circuit module 130 and the temperature sensing element 150. Since the flexible printed circuit board 140 can be easily bent, connection between parts can be stably maintained even if the battery cell 10 or the protection circuit module 130 moves in the housing 30. In more detail, the flexible printed circuit board 140 extends while penetrating a slit 135 in the circuit board 131, and one end of the flexible printed circuit board 140 is electrically connected with the wiring pattern of the protection circuit module 130 at the top surface of the circuit board 131. Accordingly, a connector (not shown) that can contact the sense line of the flexible printed circuit board 140 can be provided with general soldering and the like on the top surface of the circuit board 131.

The temperature sensing element 150 is provided at one side of the battery cell 10. The temperature sensing element 150 may be a temperature sensor, and when the temperature sensing element 150 is, for example, a negative characteristic (NTC) thermistor, an electrical resistance value may be reduced to a negative temperature coefficient as a temperature of the battery cell 10 is increased, but when the temperature sensing element 150 is provided as a positive characteristic (PTC) thermistor, the electrical resistance value is increased as the temperature of the battery cell 10 is increased. Since the temperature sensing element 150 sensitively reacts to a temperature and thus resistance of the temperature sensing element 150 is changed depending on a temperature, the protection circuit module 130 can control charging and discharging of the battery cell 10.

Specifically, the temperature sensing element 150 is provided as a chip thermistor. The chip thermistor can be simply connected to the circuit board 131 of the protection circuit module 130 through the flexible printed circuit board 140 by a solder mounting process, and accordingly, the number of processes can be reduced. Moreover, such a solder mounting process can be automated.

In order to fix the temperature sensing element 150 to the top surface of the battery cell 10, a foam member 160 is provided between the protection circuit module 130 and a part of the flexible printed circuit board 140 that supports the temperature sensing element 150. Thus, the temperature sensing element 150 is pressurized to the top surface of the battery cell 10 by the foam member 160 inserted between the flexible printed circuit board 140 and the protection circuit module 130. Selectively, the temperature sensing element 150 may be fixed to the top surface of the battery cell 10 that includes a conductive adhesive layer 170.

The foam member 160 may be formed of an electrically insulating material. The foam member 160 is preferably formed of a polymer material such as an elastomer so as to attenuate the relative movement between the battery cell 10 and the protection circuit module 130. Materials useful as the foam member include polyurethane and the like.

Figure 4:
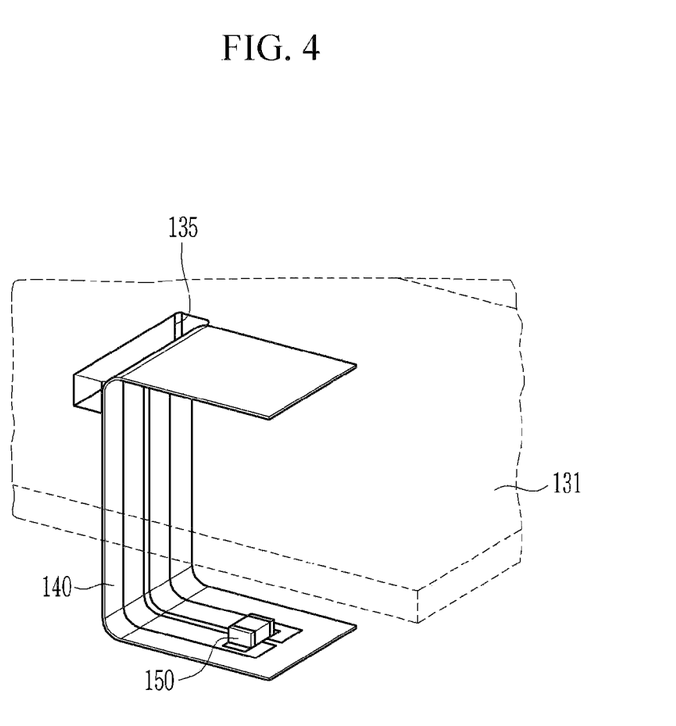
FIG. 4 is a partial perspective view of a battery module that includes a temperature sensing element combined with a rigid printed circuit board through a flexible printed circuit.

FIG. 4 is a partial perspective view of the battery module 100 including the temperature sensing element 150 that is combined with a rigid printed circuit board 131 through the flexible printed circuit board 140. For convenience in description, the battery cell 10 and the foam member 160 are not illustrated in FIG. 4, and the rigid printed circuit board 131 is semi-transparently illustrated by dotted lines. As shown in the drawing, the flexible printed circuit board 140 extends to a surface that opposes the battery cell from a surface that faces the battery cell through the slit 135 of the rigid printed circuit substrate 131. The flexible printed circuit board 140 is combined with a wiring pattern (not shown) at the top surface of the rigid printed circuit board 131.

Figure 5:
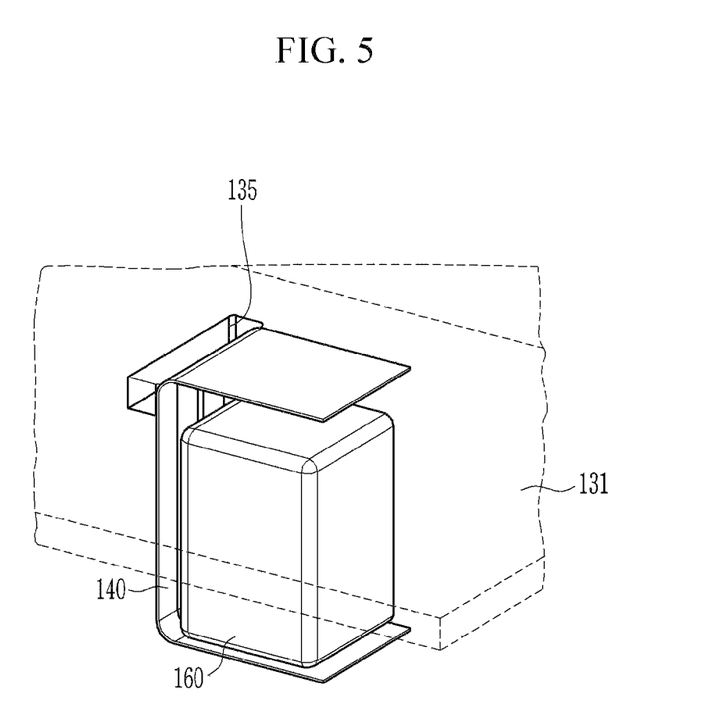
FIG. 5 is a partial perspective view of a battery module that includes a temperature sensing element combined with a rigid printed circuit board through a flexible printed circuit including a foam member.

FIG. 5 is a partial perspective view of the battery module 100 to which the foam member 160 of FIG. 4 is additionally illustrated.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

| | |
|---|---|
| 10: battery cell | 133: semiconductor element |
| 100: battery module | 135: slit |
| 11, 12: electrode terminal | 140: flexible printed circuit board |
| 130: protection circuit module | 150: temperature sensing element |
| 131: right printed circuit board | 160: foam member |
| 132a, 132b: connection terminal | |
| 170: heat conductive adhesive layer | |

The invention claimed is:

1. A battery module comprising:
   at least one battery cell;
   a protection circuit module that includes a rigid printed circuit board, and is electrically connected with the battery cell;
   at least one temperature sensing element provided at a surface of the battery cell; and
   a flexible printed circuit board that electrically connects the protection circuit module and the temperature sensing element, wherein the rigid printed circuit board comprises a slit, and the flexible printed circuit board extends to a top surface of the rigid printed circuit board from the temperature sensing element through the slit and is combined with the protection circuit module at the top surface of the rigid printed circuit board.

2. The battery module of claim 1, comprising a foam member disposed between a bottom surface of the rigid printed circuit board and the temperature sensing element.

3. The battery module of claim 2, wherein the foam member is formed of an electrically insulating material.

4. The battery module of claim 2, wherein the foam member is configured to press the temperature sensing element at the top surface of the battery cell.

5. The battery module of claim 1, wherein a heat conductive adhesive layer is provided between the temperature sensing element and a surface of the battery cell.

6. A vehicle comprising the battery module of claim 1.

* * * * *